United States Patent [19]

Tu et al.

[11] Patent Number: 5,262,668
[45] Date of Patent: Nov. 16, 1993

[54] SCHOTTKY BARRIER RECTIFIER INCLUDING SCHOTTKY BARRIER REGIONS OF DIFFERING BARRIER HEIGHTS

[75] Inventors: Shang-hui L. Tu, Chandler, Ariz.; Bantval J. Baliga, Raleigh, N.C.

[73] Assignee: North Carolina State University at Raleigh, Raleigh, N.C.

[21] Appl. No.: 930,147

[22] Filed: Aug. 13, 1992

[51] Int. Cl.$^5$ .................................. H01L 29/48
[52] U.S. Cl. ................................. 257/475; 257/478; 257/594; 257/621; 257/622
[58] Field of Search ............ 257/475, 478, 594, 621, 257/622

[56] References Cited

U.S. PATENT DOCUMENTS 4,646,115 2/1987 Shannon et al. .................. 257/478
5,040,034 8/1991 Murakami et al. ................ 257/471

OTHER PUBLICATIONS

Modern Power Devices, B. J. Baliga, John Wiley and Sons, Inc., 1987, pp. 406-451.
Semiconductor Devices, Physics and Technology, S. M. Sze, John Wiley & Sons, 1985, p. 163.

Primary Examiner—Edward Wojciechowicz
Attorney, Agent, or Firm—Bell, Seltzer, Park & Gibson

[57] ABSTRACT

A Schottky barrier rectifier includes regions of different Schottky barrier heights. Preferably, alternating regions of relatively high and relative low barrier heights are provided on a semiconductor substrate and are electrically connected in parallel to form a single Schottky barrier rectifier. The alternating regions may be provided by laterally spaced apart regions of a first metal on the semiconductor substrate and a layer of a second metal on the regions of the first metal and on the semiconductor substrate between the regions of first metal. Alternatively, a plurality of spaced apart barrier altering regions, such as a plurality of shallow implants, are formed in the semiconductor substrate, and a continuous metal layer is formed on the semiconductor substrate. In yet another embodiment, plurality of laterally spaced apart trenches are formed in the semiconductor substrate. First metal regions are formed at the bottom of each trench and a second metal layer is formed on the trench bottoms, trench walls and on the substrate face between the trenches. Still alternatively, a barrier height altering region, such as a shallow implant, is formed in the semiconductor substrate adjacent the trench bottoms, and a metal layer is formed on the trench bottoms, on the trench walls and on the first face between the trenches.

7 Claims, 11 Drawing Sheets

SCHOTTKY BARRIER RECTIFIER INCLUDING SCHOTTKY BARRIER REGIONS OF DIFFERING BARRIER HEIGHTS

Field of the Invention

This invention relates to rectifiers and more particularly to metal-semiconductor rectifier devices.

BACKGROUND OF THE INVENTION

Schottky barrier rectifiers are extensively used as output rectifiers in switching mode power supplies and in other power applications for carrying large currents at high voltages. As is well known to those having skill in the art, a rectifier exhibits a very low resistance to current flow in one direction and a very high resistance to current flow in the opposite direction. As is also well known to those having skill in the art, a Schottky barrier rectifier produces rectification as a result of nonlinear current transport across a metal-semiconductor contact.

A Schottky barrier rectifier power device, for carrying large currents at high voltages, typically contains a relatively large active area where the metal-semiconductor contact is made. The Schottky barrier height in the active area is determined by the metal, and is the same over the entire active area. In a Schottky power rectifier, the dominant current flow is by thermionic emission. Reverse blocking takes place by introducing a depletion layer into the semiconductor substrate.

Two important device characteristics for the Schottky barrier rectifier are the on-state (or forward) voltage drop and the reverse leakage current. The on-state voltage drop is the voltage across the rectifier during forward current conduction. As the power supply voltage for modern electronic devices continues to decrease, it is desirable to decrease the on-state voltage drop of the device. The reverse leakage current is the leakage current which flows through the device when it is in blocking mode. In order to reduce the power dissipation during reverse blocking mode, it is desirable to decrease the reverse leakage current.

Unfortunately, there is a tradeoff between the forward voltage drop and the reverse leakage current in a Schottky barrier rectifier, so that it is difficult to minimize both characteristics simultaneously. In particular, as the Schottky barrier height is reduced, the forward voltage drop decreases but the leakage current increases. Conversely, as the barrier height is increased, the forward voltage drop increases but the leakage current decreases.

In designing Schottky barrier rectifiers, a barrier height is selected based on the intended device application. Low barrier heights are typically used for Schottky rectifiers intended for high current operation with large duty cycles, where the power losses during forward conduction are dominant. Larger barrier heights are typically used for Schottky rectifiers intended for applications with higher reverse bias stress and higher ambient temperatures.

The Schottky barrier height is related to the work function of the metal used in the Schottky barrier rectifier. A graphical illustration of the relationship between metal work function and Schottky barrier height may be found in Chapter 5, FIG. 3 of the textbook by S. M. Sze entitled Semiconductor Devices, Physics and Technology, John Wiley & Sons, 1985, at page 163. As shown, the following sequence of metals exhibit increasing work functions and increasing barrier heights: magnesium (Mg), hafuium (Hf), Aluminum (Al), Tungsten (W), palladium (Pd) and platinum (Pt). Among the most commonly used metals, platinum and molybdenum barrier devices exhibit the best behaved forward conduction characteristics. The leakage current of tungsten Schottky barrier rectifiers is lower, but their forward voltage drop is greater than for platinum and molybdenum devices.

The desired barrier height for Schottky power rectifiers may be obtained by selecting the appropriate metal to form the Schottky barrier. However, it is well known by those having skill in the art that the effective barrier height can also be altered by a very shallow ion implant, typically less than 100Å thick, at the surface of the semiconductor substrate, with a carefully controlled dose. For an n-type semiconductor substrate, an n-type implant layer will lower the barrier height, whereas a p-type layer will raise it. Barrier altering implants are often used because they allow selection of the metal based on the metallurgical properties of the interface which will produce the most reliable operation, while allowing tailoring of the barrier height by controlling the ion implant dose. Optimization of the Schottky barrier can be achieved by starting with a larger Schottky barrier height and lowering it with an implant layer. Optimization of a Schottky barrier can also be achieved by starting with a low Schottky barrier height metal and raising it with an implant layer.

It is important to maintain the implanted charge close to the surface, adjacent the metal. Antimony implantation at energies of 5–10 keV is effective for accomplishing barrier height altering in n-type silicon because its larger mass results in a shallow implantation depth, and its low diffusion coefficient prevents redistribution during subsequent implant activation or other high temperature processing steps. A detailed and comprehensive discussion of the design of Schottky barrier power rectifiers may be found in Section 8.2 of the textbook entitled Modern Power Devices by coinventor B. J. Baliga, published by John Wiley and Sons, Inc., 1987, the disclosure of which is hereby incorporated herein by reference.

One attempt to reduce the on-state voltage drop/reverse leakage current tradeoff of the Schottky barrier rectifier is the Junction Barrier controlled Schottky (JBS) rectifier. The JBS rectifier is a Schottky rectifier structure with a p-n junction grid integrated into its semiconductor substrate. This device structure is also called a "pinch" rectifier. The junction grid is designed so that its depletion layers do not pinch-off under zero and forward bias conditions. The device thereby contains multiple conductive channels under the Schottky barriers through which current can flow during forward bias operation.

Under reverse bias, the depletion layers formed at the p-n junctions spread into the channel under the Schottky barriers. The junction grid is designed so that the depletion layers intersect under the Schottky barrier when the reverse bias exceeds a few volts, to thereby pinch-off the conductive channels. After depletion layer pinch-off, a potential barrier is formed in the channel, and further increases in applied voltage are supported by the depletion layer extending away from the Schottky barrier. The potential barrier shields the Schottky barrier from the applied voltage. This shielding prevents Schottky barrier lowering and eliminates the large increase in leakage current for conventional Schottky rectifiers.

Because of this suppressed leakage current, the Schottky barrier used in the JBS rectifier can be significantly less than that for conventional Schottky rectifiers. This has allowed a reduction in the forward voltage drop while maintaining an acceptable reverse blocking characteristic. The design and operation of the JBS rectifier is described in Section 8.4 of the above cited textbook by coinventor Baliga. Notwithstanding this development, there continues to be a need for a Schottky barrier rectifier which minimizes the on-state voltage drop and the reverse leakage current.

SUMMARY OF THE INVENTION

It is therefore an object of the present invention to provide an improved Schottky barrier rectifier.

It is another object of the present invention to provide an improved Schottky barrier rectifier which can exhibit low on-state voltage drop and low reverse leakage current.

These and other objects are provided according to the present invention, by a Schottky barrier rectifier which includes regions of different Schottky barrier heights. Preferably, alternating regions of relatively high and relatively low barrier heights are provided on a semiconductor substrate, and are electrically connected in parallel to form a single Schottky barrier rectifier. During reverse blocking mode the Schottky barrier regions with the relatively large barrier height reduce the reverse leakage current, by producing a barrier under the Schottky barrier regions with the lower barrier height. During the forward conduction mode, current can still flow through the Schottky barrier regions with the larger barrier height. Thus, a more favorable tradeoff between on-state voltage drop and reverse leakage current is obtained.

A semiconductor rectifier according to the present invention includes a semiconductor substrate having first and second opposing faces. An array of Schottky contacts is formed on the first face, with alternating ones of the Schottky contacts having relatively low barrier height and relatively high barrier height. An ohmic contact is formed on the second face. The semiconductor substrate may include a relatively highly doped portion adjacent the second face and a relatively lightly doped portion adjacent the array of Schottky contacts. The lightly doped portion is also referred to as the "drift region".

Many embodiments of the Schottky barrier rectifier having relatively high and relatively low barrier height regions may be provided according to the invention. In one embodiment, alternating first and second metal regions are formed on the first face of a semiconductor substrate. To ease manufacturability, laterally spaced apart metal regions, preferably a metal with a relatively high barrier height, are formed on the first face. A metal layer, preferably having a relatively low barrier height, is formed on the high barrier height metal regions and on the first face between the high barrier height metal regions. The low barrier height metal forms ohmic contacts with the high barrier height metal regions, and forms low barrier height Schottky contacts with the semiconductor substrate between the regions of high barrier height.

In another embodiment of the present invention, relatively low and relatively high barrier heights may be produced by forming a plurality of laterally spaced apart barrier altering regions, such as a plurality of shallow implants, in the semiconductor substrate at the first face. A metal layer may then be formed on the first face over the barrier height altering regions and between the barrier height altering regions. The barrier height altering regions may be barrier height raising or lowering regions or both.

In yet another embodiment of the present invention, the first face of the semiconductor substrate includes a plurality of laterally spaced apart trenches. The Schottky contacts having a first barrier height are formed at least partially within the trenches and the Schottky contacts having the second barrier height are formed at least partially on the first face between the laterally spaced apart trenches. Preferably, a first barrier height metal region is formed at the bottom of each trench and a second barrier height metal layer is formed on the first barrier height metal regions, on the trench bottoms, on the trench walls and on the first face between the trenches.

Alternatively, a barrier height altering region, such as a shallow implant, is formed in the semiconductor substrate adjacent the trench bottoms and a metal layer is formed on the trench bottoms, on the trench walls and on the first face between the trenches. The first barrier height metal on the trench bottoms is preferably a high barrier height metal, and the barrier height altering regions at the trench bottoms are preferably barrier height raising regions. The second barrier height metal is preferably a low barrier height metal.

The above described trench structures form a large area of low barrier height Schottky contact, including the first face between the trenches and the trench walls. The on-state voltage drop can thus be small due to the large current conduction area. By utilizing fine photolithographic features and deep trenches, the current conduction area of the trench structure Schottky barrier reaction can be made larger than a planer Schottky diode of the same size. Hence, the on-state drop of the rectifier can be lower than a conventional Schottky diode having the same barrier height.

During reverse blocking, the depletion regions from the metal-semiconductor interface along the trench walls will intersect and provide a strong pinch-off effect, similar to that described above for the JBS rectifier. The pinch-off effect suppresses the increase in reverse leakage current flowing through the low barrier contact as the reverse blocking voltage increases. The high barrier height metal or barrier increasing regions at the bottom of the trenches prevents the leakage current from flowing through these regions during the reverse blocking stage. As a result, low leakage current is obtained. Accordingly, a more favorable tradeoff between on state voltage drop and reverse leakage current may be obtained by the present invention, compared with a single barrier height Schottky rectifier or a JBS rectifier.

DETAILED DESCRIPTION OF A PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 1:
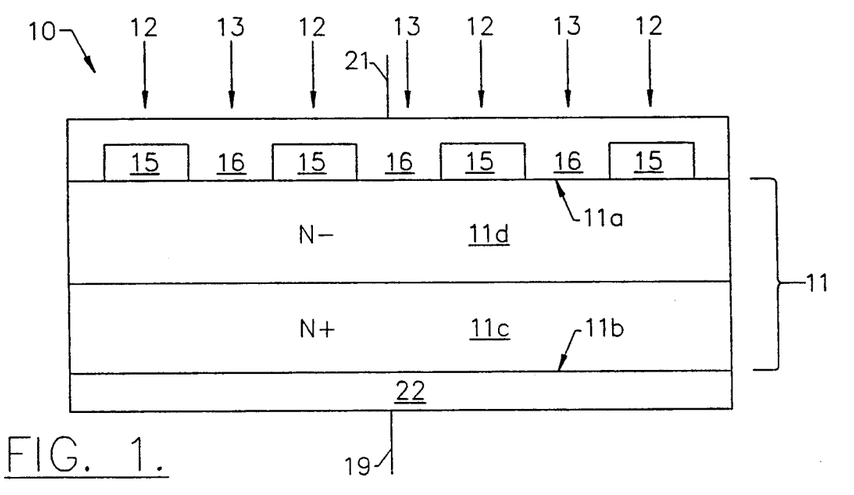
FIG. 1 illustrates a cross-sectional view of a first embodiment of a Schottky barrier rectifier according to the present invention.

Referring now to FIG. 1, a cross-sectional illustration of a first embodiment of a Schottky barrier rectifier according to the present invention is disclosed. Schottky barrier rectifier 10 includes a semiconductor substrate 11 of first conductivity type, typically N-type conductivity, having a first face 11a and a second opposing face 11b. Portion 11c, adjacent the second face 11b, is typically relatively heavily doped, shown by N+ in FIG. 1. Portion 11d, adjacent first face 11a, is typically relatively lightly doped, as shown by N− in FIG. 1. Portion 11d is also referred to as the "drift" region.

As shown in FIG. 1, rectifier 10 includes alternating regions of a first barrier height 12 and a second barrier height 13. The regions of a first barrier height 12 are formed by laterally spaced apart first metal regions 15, and regions of second barrier height 13 are formed by laterally spaced apart second metal regions 16. As shown in FIG. 1, second metal regions 16 also extend onto first metal regions 15 and form an ohmic contact therewith. An ohmic contact layer 22 on the second face 11b of substrate 11 is also provided. An anode electrode 21 and a cathode electrode 19 complete the device.

In a preferred embodiment, first metal regions 15 are platinum, having relatively high barrier height and second metal regions 16 are chromium having a relatively low barrier height. The portions of chromium regions 16 which are on platinum regions 15 form an ohmic contact therewith. The Schottky barrier regions with the larger barrier height 15 reduce the reverse leakage current by producing a barrier under the Schottky barrier regions with the lower barrier height 16. During the on-state, some current can still flow through the Schottky barrier region with the larger barrier height 15. Thus, a more favorable trade-off between on-state voltage drop and reverse leakage current is obtained.

Figure 2:
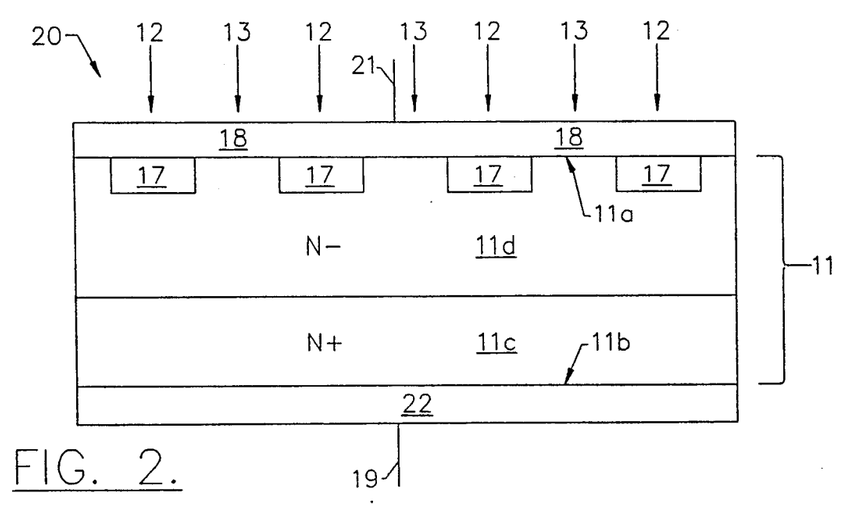
FIG. 2 illustrates a cross-sectional view of a second embodiment of a Schottky barrier rectifier according to the present invention.

Referring now to FIG. 2, an alternative embodiment of the present invention is shown. In FIG. 2, Schottky barrier rectifier 20 uses a single metal layer 18 with laterally spaced apart barrier altering regions 17 thereunder. Preferably, for an N-type drift region 11d, metal layer 18 is a relatively low barrier height metal such as chromium, and barrier altering regions 17 are shallow P-type implants with a dose of about 1e12 cm$^{-2}$, to raise the barrier height locally. Alternatively, if metal layer 18 is a high barrier height metal, an N-type implanted region 17 can be used to lower the barrier height locally.

Figure 3:
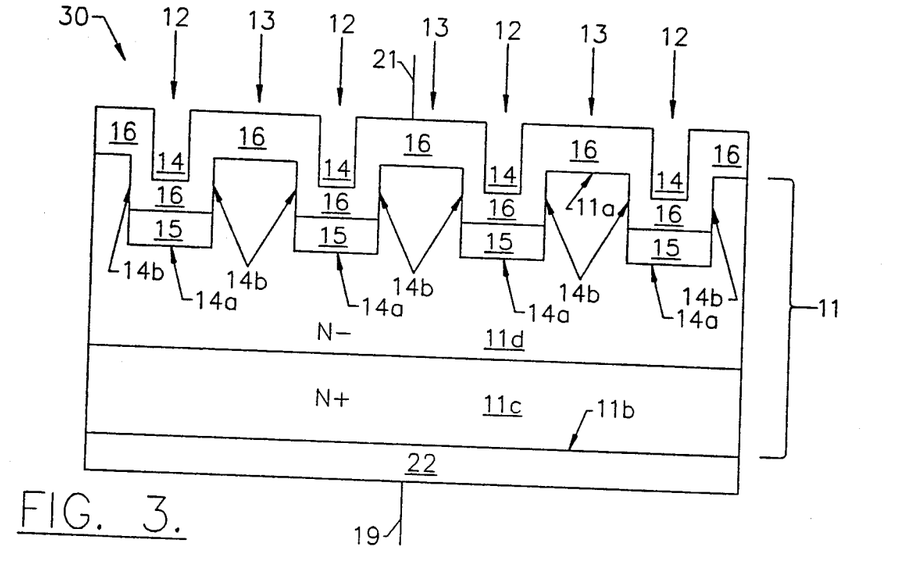
FIG. 3 illustrates a cross-sectional view of a third embodiment of a Schottky barrier rectifier according to the present invention.

FIG. 3 illustrates another embodiment of the present invention. In FIG. 3, device 30 includes a plurality of laterally spaced apart trenches 14 at face 11a of substrate 11. The trenches each include a trench bottom 14a and trench walls 14b. As shown in FIG. 3, first metal regions 15 are formed on the bottoms 14a of trenches 14. A second metal layer 16 is formed on first metal regions 15 on the trench bottoms, and is also formed on the trench walls 14b and on the first face 11a of substrate 11 between trenches 14. Preferably, first metal regions 15 are a relatively high barrier height metal, and second metal layer 16 is preferably a relatively low barrier height metal. Accordingly, alternating regions of first and second barrier heights 12 and 13, respectively, are formed. It will be understood by those having skill in the art that first metal regions 15 may also extend along the trench walls 14b and substrate face 11a, or may extend only on part of trench bottoms 14a.

Figure 4:
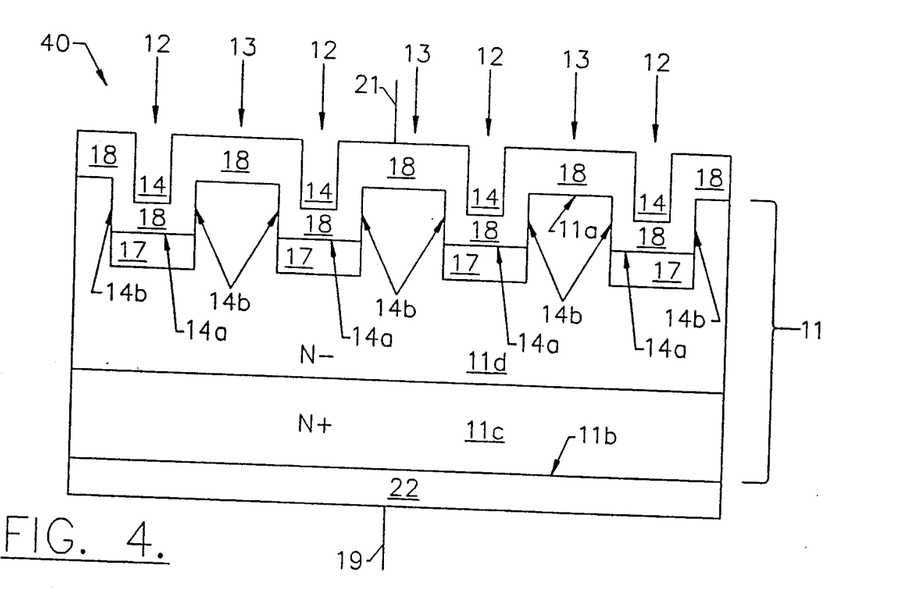
FIG. 4 illustrates a cross-sectional view of a fourth embodiment of a Schottky barrier rectifier according to the present invention.

FIG. 4 illustrates yet another embodiment of a Schottky barrier rectifier according to the present invention. Rectifier 40 includes trenches as was the case in FIG. 3. However, barrier altering regions 17 are formed in the semiconductor substrate adjacent the trench bottoms 14a. A continuous metal layer 18 is then formed on the first face of the semiconductor substrate including the trench walls 14b and trench bottom 14a. Preferably, the metal layer 18 is a low barrier height metal and the shallow implant 17 is a barrier height raising implant. For the N-drift layer 11d shown in FIG. 4, a P+ shallow implant is formed. It will be understood by those having skill in the art that barrier altering regions 17 may also extend along trench walls 14b and along first face 11a of substrate 11, or may extend only along part of trench bottoms 14a.

The trench structures of FIGS. 3 and 4 produces a large area of low barrier Schottky contact along the trench walls 14b and the first face 11a of substrate 11 between the trenches 14. The on-state voltage drop is thus small due to large current conduction area. By utilizing fine photolithographic features and deep trenches, the current conduction area can be made larger than that of a planar Schottky diode of the same size. Hence, the on-state drop of the diode of FIGS. 3 and 4 can be lower than that of a conventional Schottky diode having the same barrier height. During reverse blocking, depletion regions from the metal-semiconductor interface along the trench walls 14b will intersect and provide a strong pinch-off effect. The pinch-off effect suppresses the increase in reverse leakage current flowing through the low barrier contact as the reverse blocking voltage increases. The use of the high barrier height metal or barrier altering regions 15 or 17 respectively, at the trench bottom 14a, prevents leakage current from flowing through these regions during reverse blocking mode.

Figure 5A:
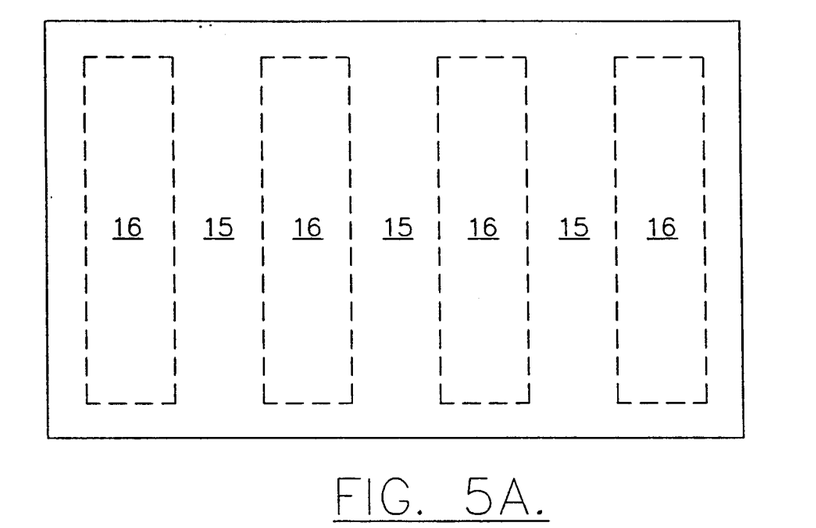
FIGS. 5A–5C illustrate alternative top views of the structures of FIGS. 1 and 3.
Figure 5B:
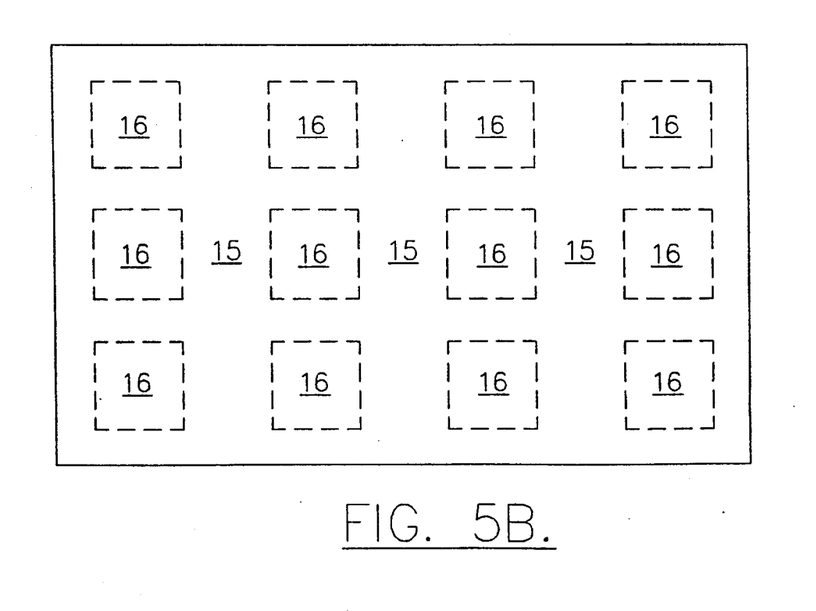
Figure 5C:
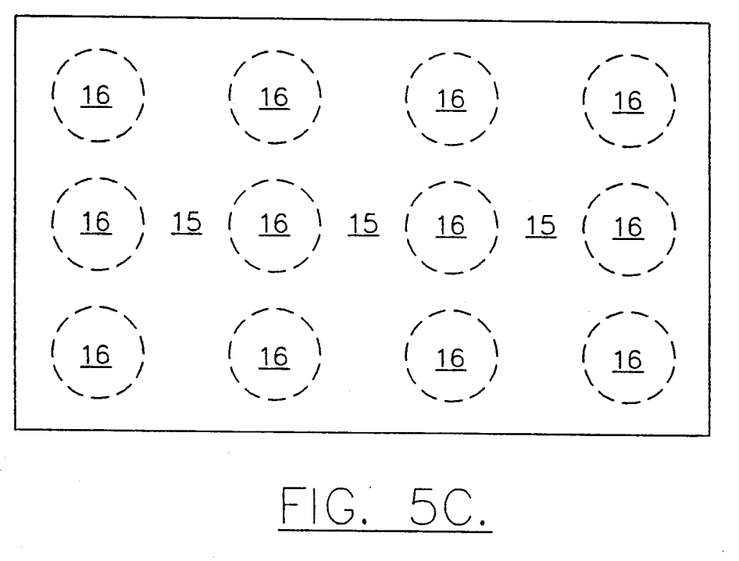

FIGS. 5A–5C illustrate alternative top views of the structures of FIGS. 1 and 3 and illustrate the first metal layer 15 beneath second metal layer 16. As shown, regions of first metal layer 15 may be elongated (FIG. 5A), square (FIG. 5B), or any other polygonal shape, or circular (FIG. 5C). Other shapes may be envisioned.

Figure 6:
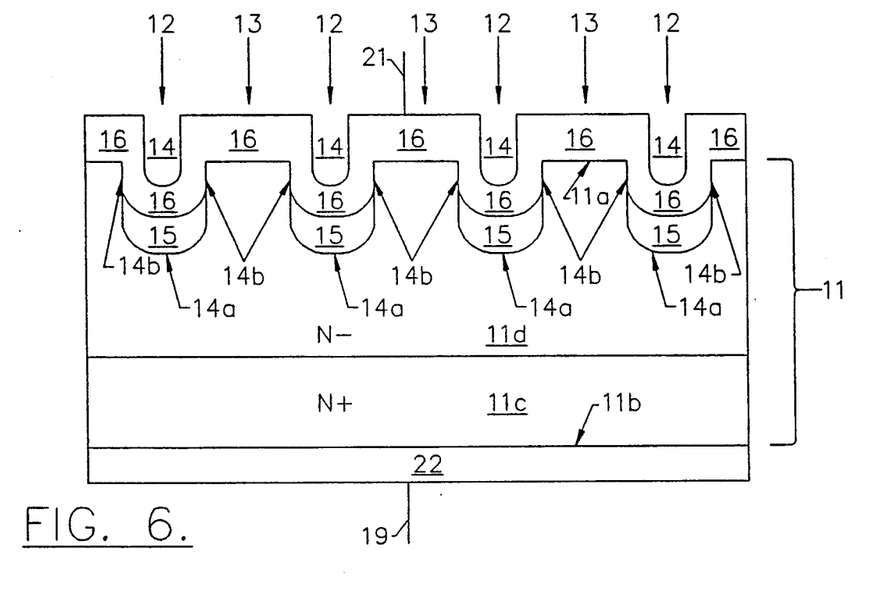
FIG. 6 illustrates a cross-sectional view of a fifth embodiment of a Schottky barrier rectifier according to the present invention.

FIG. 6 illustrates an alternative embodiment of FIG. 3, in which the trench bottoms 14a are nonplanar rather than planar. Other transverse cross-sections of the trenches may be used.

Figure 7A:
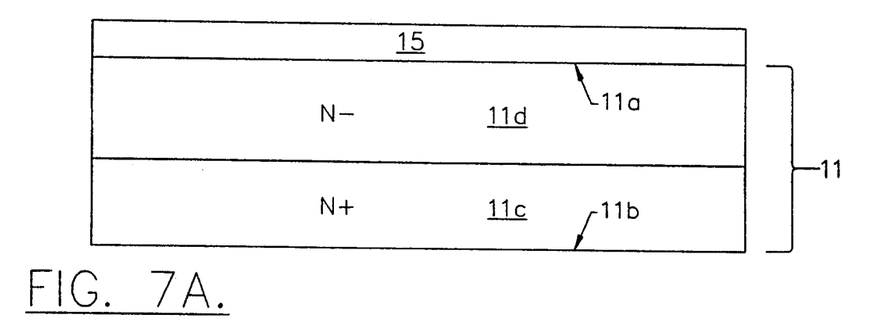
FIGS. 7A–7C are cross-sectional views of the structure of FIG. 1 during intermediate fabrication steps.
Figure 7B:
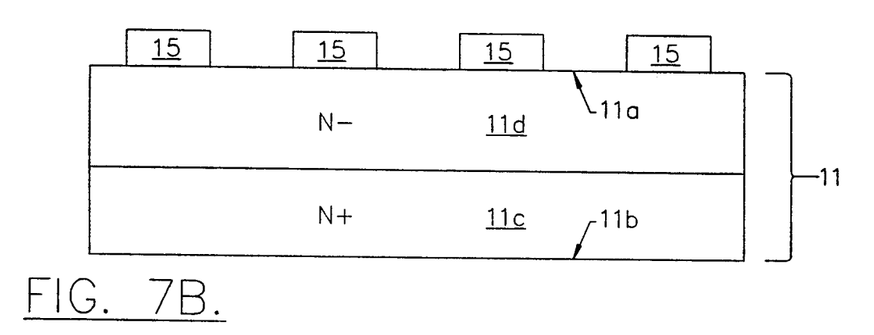
Figure 7C:
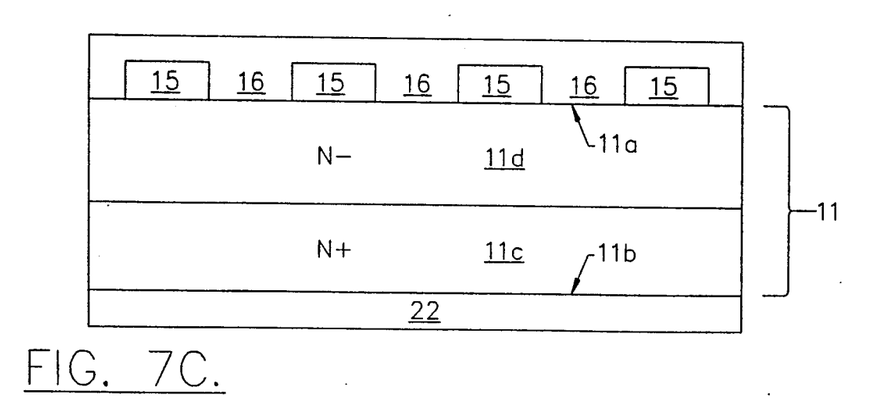

Referring now to FIGS. 7A-7C, a process for fabricating device 10 of FIG. 1 will now be described. Referring to FIG. 7A, substrate 11 is first formed by epitaxially growing layer 11d on layer 11c. Layer 11c is preferably a 0.002Ω-cm N-type silicon wafer doped at about $10^{19}$ dopants-cm$^{-3}$. Epitaxial layer 11d is preferably a 0.5Ω-cm <111>, epitaxial silicon layer about 3 μm thick. A first metal layer 15, preferably a platinum layer about 0.5 μm thick, is then deposited on first face 11a.

Then, referring to FIG. 7B, layer 15 is patterned using conventional photolithographic techniques to form a plurality of laterally spaced apart first metal regions 15 on face 11a. Regions 15 are preferably between about 0.5 μm and 2 μm wide and the spacing between regions 15 is preferably between about 0.5 μm and 2 μm. Then, referring to FIG. 7C, second metal layer 16 is blanket deposited on face 11a using well known deposition techniques. Layer 16 is preferably about 1 μm thick on face 11a of the semiconductor substrate, and is preferably a continuous metal layer. Second face 11b is then metallized to form an ohmic contact, for example by depositing about 2 μm of aluminum. Anode and cathode contacts, 21 and 19 respectively, are then formed to produce the device of FIG. 1.

Figure 8A:
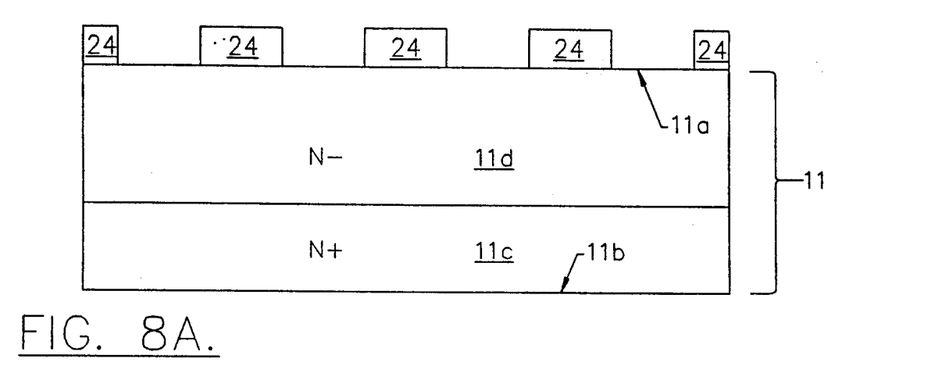
FIGS. 8A–8C are cross-sectional views of the structure of FIG. 2 during intermediate fabrication steps.
Figure 8B:
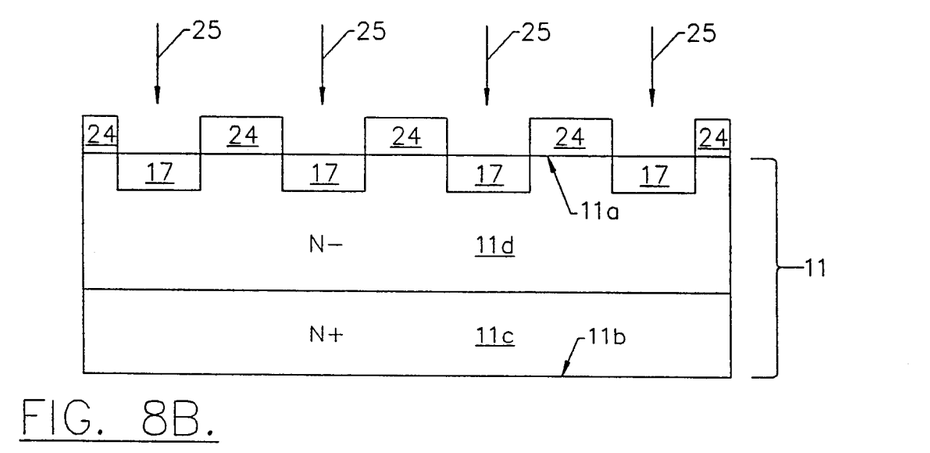
Figure 8C:
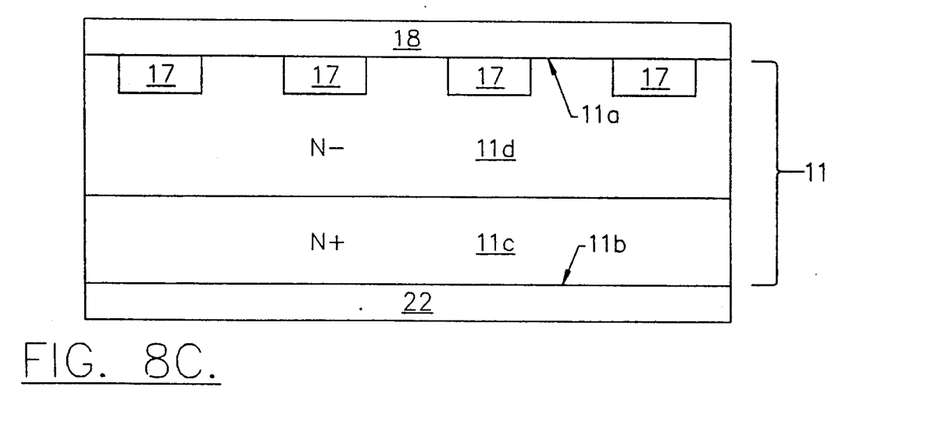

Referring now to FIGS. 8A-8C, a process for fabricating device 20 of FIG. 2 will now be described. Referring to FIG. 8A, substrate 11 is formed as was already described. Then, a mask 24, such as a silicon dioxide mask is formed and patterned using conventional techniques.

Then, referring to FIG. 8B, a shallow implant of appropriate dopant ions is directed at the substrate in the direction shown by arrows 25 to form shallow doped barrier altering regions 17. It will be understood by those having skill in the art that mask 24 absorbs the dopant ions 25 and prevents the dopant ions from entering into first face thereunder. Mask layer 24 is then removed. Then, as shown in FIG. 8C, a metal layer 18 is blanket deposited on first face 11a. Layer 18 is preferably between about 0.5 μm and 1 μm thick, and is preferably a continuous metal layer. Layer 22 is then deposited, and anode and cathode contacts are formed to produce the device of FIG. 2.

Figure 9A:
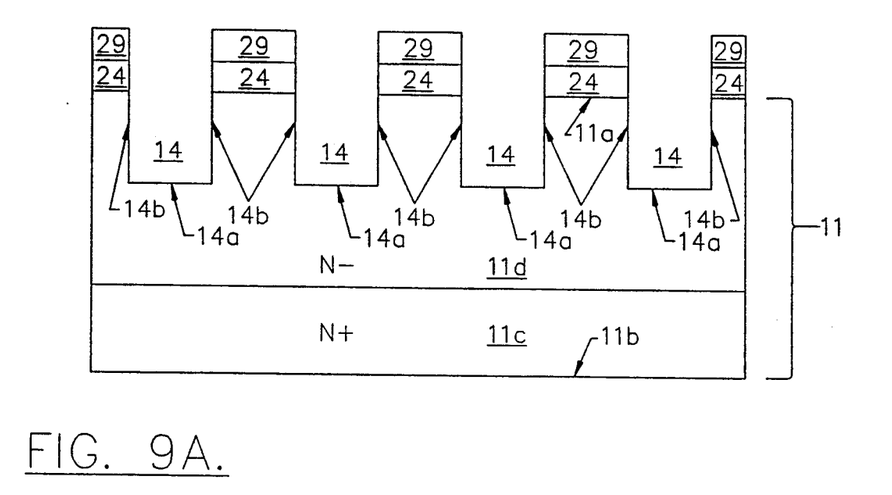
FIGS. 9A–9C are cross-sectional views of the structure of FIG. 3 during intermediate fabrication steps.
Figure 9B:
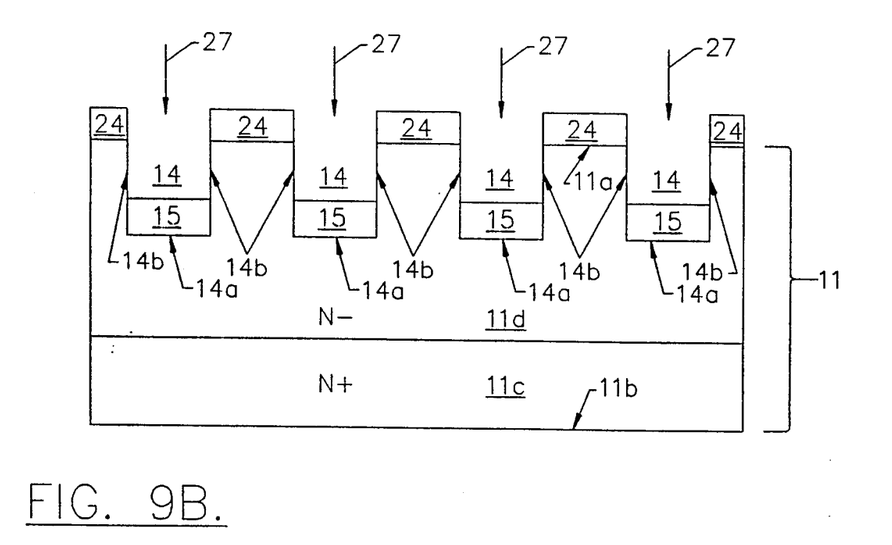
Figure 9C:
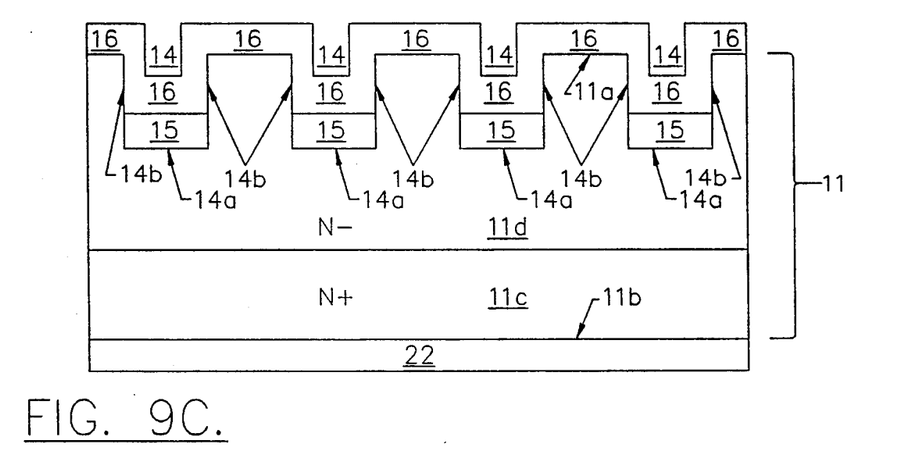

Referring now to FIGS. 9A-9C, a process for fabricating the device 30 of FIG. 3 will now be described. Referring to FIG. 9A, substrate 11 is formed as was already described. Then, a mask layer 24 such as a silicon dioxide layer about 1 μm thick is formed on face 11a and a photoresist layer 29 is formed on the mask layer 24. The photoresist layer 29 and mask layer 24 are patterned using standard lithographic techniques. Trenches 14 are then etched into layer 14d at face 11a through photoresist 29 and oxide mask 24. Deep trenches may be obtained by reactive ion etching (RIE) in a process similar to that described in a publication entitled Reactive Ion Etching of Silicon Trenches Using SF$_6$/O$_2$ Gas Mixtures by Syau, coinventor Baliga and Hamaker, Journal of the Electrochemical Society, Vol. 138, No. 10, pp. 3076-3081, October 1991, the disclosure of which is hereby incorporated herein by reference. The RIE system may be a SEMI GROUP Model 1000TP system, which consists of two parallel plate electrodes separated by a distance of 4.5 cm. Radio frequency power at a density of about 0.15 w/cm$^2$ may be applied to the bottom electrode which holds the wafers. The RIE plasma source may be a 75% SF$_6$ and 25% O$_2$ gas mixture. Etching times of twenty, thirty, forty and fifty minutes result in trench depths of 5 μm, 8 μm, 10 μm and 12 μm, respectively.

As shown in FIG. 9B, after reactive ion etching, first metal layer 15 is deposited on the bottoms 14a of trenches 14 by sputter deposition followed by photoresist layer 29 liftoff. Preferably the thickness of layer 15 is between about 0.2 μm and 0.5 μm.

Then referring to FIG. 9C, second metal layer 16 is conformally deposited using sputter deposition or other known processes. Layer 16 is preferably a continuous layer between 0.5 μm and 1 μm thick. The device is completed as already described.

Figure 10A:
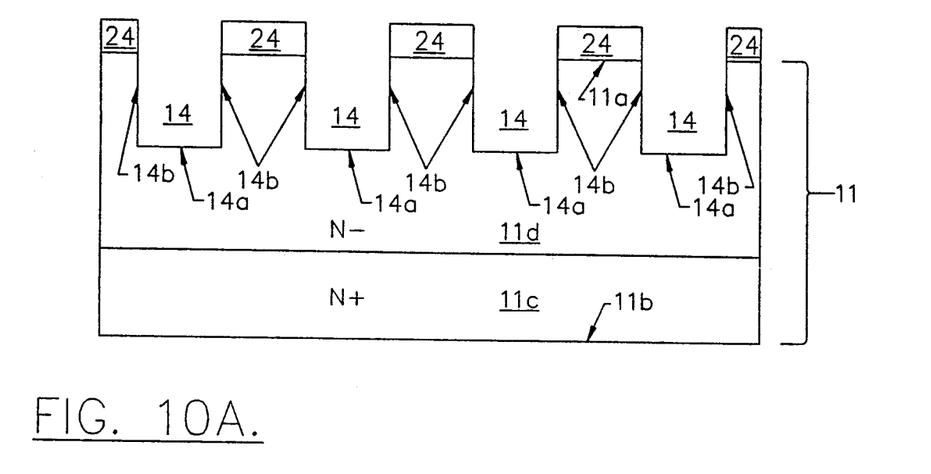
FIGS. 10A–10C are cross-sectional views of the structure of FIG. 4 during intermediate fabrication steps.
Figure 10B:
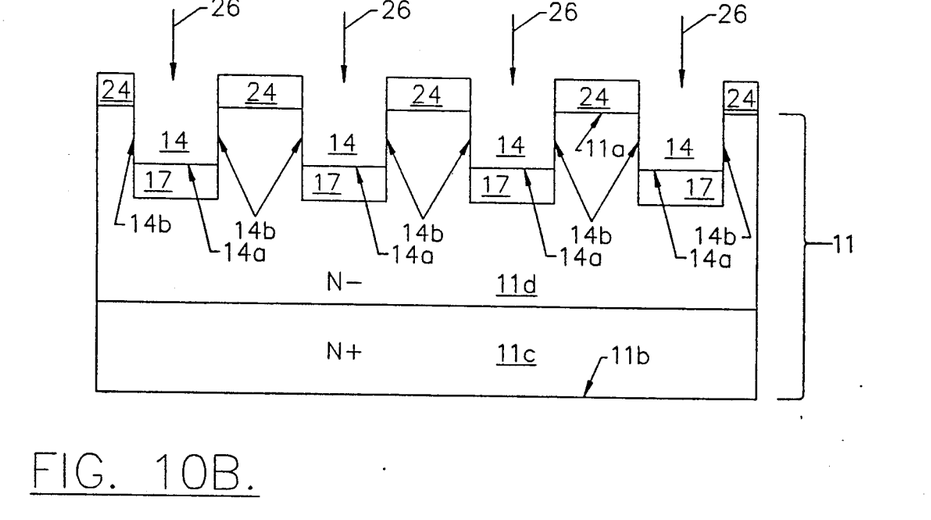
Figure 10C:
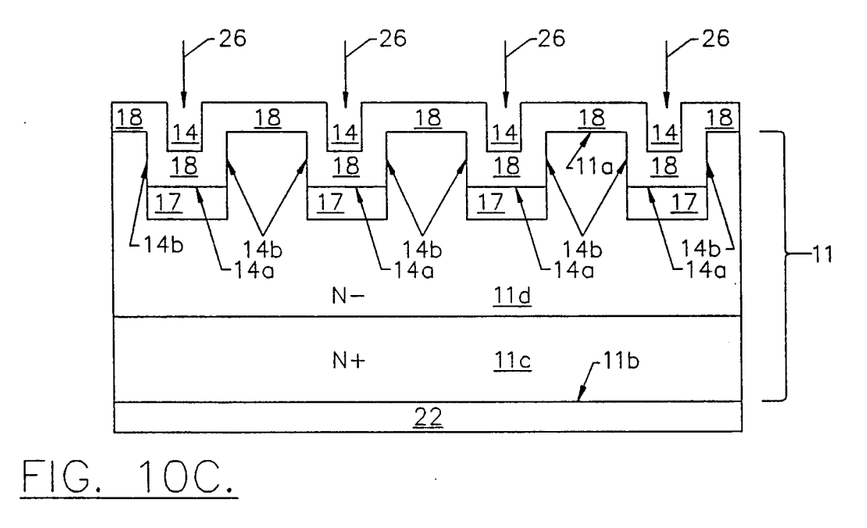

Finally, referring to FIGS. 10A-10C, a process for fabricating device 40 of FIG. 4 will now be described. FIG. 10A is identical to FIG. 9A. Then, referring to FIG. 10B, a shallow implant of ions 26 is formed at the bottom 14b of trenches 14, as was already described with respect to FIG. 8B above. Mask layer 24 is then removed. Then, as shown in FIG. 10C, a conformal deposition of metal layer 18 is provided. The device is completed as already described.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A semiconductor rectifier comprising:
   a semiconductor substrate having first and second opposing faces;
   an array of Schottky contacts at said first face, wherein alternating ones of said Schottky contacts have relatively low barrier height and relatively high barrier height; and
   an ohmic contact on said second face;
   wherein said semiconductor substrate includes a plurality of spaced apart trenches in said first face;
   wherein said array of Schottky contacts having alternating high and low barrier height are in said trenches and on said first face between said trenches; and
   wherein said trenches each include a bottom and a wall; wherein said Schottky contacts having relatively high barrier height are on said trench bottoms; and wherein said Schottky contacts having relatively low barrier heights are on said trench walls and on said first face between said trenches.

2. The semiconductor rectifier of claim 1 wherein said Schottky contacts having relatively high barrier height comprise first metal regions on said trench bottoms and wherein said Schottky contacts having relatively low barrier height comprise second metal regions on said trench walls and on said first face between said trenches.

3. The semiconductor rectifier of claim 2 wherein said second metal regions extend onto said first metal regions.

4. A semiconductor rectifier comprising:
   a semiconductor substrate having first and second opposing faces;

a plurality of spaced apart trenches in said semiconductor substrate at said first face, each having a trench bottom and a trench wall;

a plurality of metal regions, a respective one of which is on a respective trench bottom, wherein said metal regions and said semiconductor substrate form a plurality of Schottky contacts having a first barrier height;

a metal layer on said metal regions, on said trench walls and on said first face between said trenches, wherein said metal layer and said semiconductor substrate form a plurality of Schottky contacts having a second barrier height between said trenches and on said trench walls; and an ohmic contact on said second face.

5. The semiconductor rectifier of claim 4 wherein said metal regions and said semiconductor substrate form a plurality of Schottky contacts having relatively high barrier height and wherein said metal layer and said semiconductor substrate form a plurality of Schottky contacts having relatively low barrier height.

6. The semiconductor rectifier of claim 5 wherein said metal layer forms an ohmic contact with said metal regions thereunder.

7. The semiconductor rectifier of claim 4 wherein said semiconductor substrate comprises a relatively heavily doped portion of predetermined conductivity type adjacent said second face, and a relatively light doped portion of said predetermined conductivity type adjacent said first face.

* * * * *